United States Patent
Camel et al.

(10) Patent No.: US 7,670,689 B2
(45) Date of Patent: Mar. 2, 2010

(54) SULFIDATION-RESISTANT SILVER-BASE COATING, METHOD FOR DEPOSITING SUCH A COATING AND USE THEREOF

(75) Inventors: Denis Camel, Grenoble (FR); Laurent Bedel, Quaix en Chartreuse (FR); Frédéric Sanchette, Montferrat (FR); Cédric Ducros, Bevenais (FR)

(73) Assignee: Commissariat a l'Energie Atomique, Paris (FR)

( * ) Notice: Subject to any disclaimer, the term of this patent is extended or adjusted under 35 U.S.C. 154(b) by 282 days.

(21) Appl. No.: 11/584,533

(22) Filed: Oct. 23, 2006

(65) Prior Publication Data

US 2007/0116974 A1   May 24, 2007

(30) Foreign Application Priority Data

Nov. 18, 2005   (FR) .................................. 05 11708

(51) Int. Cl.
   *B32B 9/00* (2006.01)
   *B32B 19/00* (2006.01)
   *C23C 16/00* (2006.01)

(52) U.S. Cl. ................ 428/469; 428/701; 428/702; 427/255.7

(58) Field of Classification Search ............. 148/277, 148/281, 255; 419/21; 420/501; 428/469, 428/701, 702
   See application file for complete search history.

(56) References Cited

U.S. PATENT DOCUMENTS

| 4,410,491 A | * | 10/1983 | Wolfgang et al. ............. 420/501 |
| 4,430,366 A | * | 2/1984 | Crawford et al. ............. 427/162 |
| 5,630,886 A | | 5/1997 | Hijikata et al. |
| 6,168,071 B1 | | 1/2001 | Johns |
| 2005/0089439 A1 | * | 4/2005 | Keduka et al. ............. 420/501 |

FOREIGN PATENT DOCUMENTS

| EP | 0 679 729 A1 | 11/1995 |
| WO | WO 95/13704 A1 | 5/1995 |

OTHER PUBLICATIONS

H. Renner et al..; (1993); "Silver, Silver Compounds, and Silver Alloys"; Ullmanns Encyclopedia of Industrial Chemistry; vol. A24; pp. 148-149.

* cited by examiner

*Primary Examiner*—Timothy M Speer
*Assistant Examiner*—Jonathan C Langman
(74) *Attorney, Agent, or Firm*—Oliff & Berridge, PLC

(57) ABSTRACT

The sulfidation resistance of a silver-base material coating is further improved by making a concentration gradient of silver, oxygen and of one or more oxidizable alloying elements that may be present in the material, from the free surface of the coating up to a depth comprised between 10 nm and 1 µm and more particularly between 100 nm and 1 µm. Thus, the coating comprises a stack of one main layer made from silver-base material and of one oxidized thin film. The thin film, with a thickness comprised between 10 nm and 1 µm, thus presents a decreasing silver concentration gradient from the interface between the thin film and the main layer to the free surface of the thin film. Deposition of the coating on a support can be achieved by two successive physical vapor deposition steps, and more particularly by magnetron cathode sputtering.

9 Claims, 3 Drawing Sheets

SULFIDATION-RESISTANT SILVER-BASE COATING, METHOD FOR DEPOSITING SUCH A COATING AND USE THEREOF

BACKGROUND OF THE INVENTION

The invention relates to a silver-base material coating comprising a stack of one main layer and one oxidized thin film.

The invention also relates to a method for depositing such a coating and use of such a deposition.

STATE OF THE ART

Silver-base materials are known to oxidize naturally in the ambient air. A thin layer of oxide then forms at the surface of the silver-base objects. The thickness thereof is a few nanometers.

Moreover, they are known to tarnish when placed in contact with air polluted by traces of sulfur-base compounds. Silver in fact reacts with sulfur or sulfuric acid and this reaction results in the formation of a black-colored corrosion layer, making the surface of the silver-base objects lustreless. This is the case in particular of jewellery or silverware. To eliminate this tarnishing, lacquers have to be applied or repeated maintenance operations have to be performed. In addition, this tarnishing phenomenon leads to an increase of the contact electrical resistance of the silver-base material or silver-base object. The increase of this characteristic therefore limits the use of silver-base alloys in the field of connectors, and in particular for low currents. Finally, the tarnishing phenomenon does not enable the oligodynamic properties of silver to be used in antibacterial protection applications when there is contact with polluted air. Unlike pure silver, the silver sulfide which forms at the surface of a silver-base object does not in fact present any antibacterial activity due to its low solubility in water.

A great deal of research work has been carried out to improve the sulfidation resistance or the tarnishing resistance of silver-base materials. This mainly concerns two research channels.

The first channel consists in covering the surface of the silver-base objects with a protective layer which can be metallic, made of oxide or organic, by physical or electrochemical deposition. For example, the metallic protective layers used are layers of gold, palladium, platinum or rhodium, with a thickness of some 10 nm to 20 nm. The oxide protective layers are for example made of alumina, zircon, titanium oxide or tin. However, the use of a protective layer to improve the sulfidation resistance is not satisfactory in so far that it often impairs the superficial properties of the object, such as the color, reflectivity, and contact electrical resistance. Moreover, the protective barrier it forms is not totally reliable and is not very lasting. It is in fact sensitive to the defects of the coating and to wear.

The second channel consists in alloying silver with metallic alloying elements. For example, in the article "Silver, silver compounds and silver alloys" (Ullmann's Encyclopedia of Industrial Chemistry, 1993 VCH Publishers, Inc, Vol. A24, pages 148-149), H. Renner describes the tarnishing phenomenon of silver and indicates that incorporating gold, platinum or palladium in the alloy improves the tarnishing resistance. However, silver and noble metal-based alloys only provide an improvement of the sulfidation resistance for high alloy contents. Noble metals in fact do not migrate by nature to the surface of the silver.

To reduce the tarnishing effect, silver can also be alloyed with one or more metallic and oxidizable alloying elements, such as germanium or tin. The U.S. Pat. No. 6,168,071 mentions for example addition of a small quantity of germanium in a silver and copper based alloy to reduce the tarnishing effect. The alloy thus comprises at least 77% in weight of silver, and from 0.4% to 7% in weight of germanium, the rest being mainly copper or boron. The metallic and oxidizable alloying elements in fact enable a native oxide protective film to form by segregation at the surface of the silver-base material. However, this protective film is not sufficiently efficient to stop the sulfidation phenomenon. The film in fact remains very thin, with a thickness of less than 10 nm, and can only regenerate very slowly by diffusion of the solute(s) contained in the silver matrix to the free surface. Moreover, when the alloys are achieved by casting, their behaviour is sensitive to the micro-segregations originating from the solidification step. Variations of composition therefore may occur in the solid solution, and especially precipitation of the intermetallic phases formed between the different constituents may take place, making formation of the native oxide film random.

Magnesium is also known to protect a silver-base material. The U.S. Pat. No. 5,630,886 proposes for example a composite coating able to be used as a reflecting film and comprising a silver substrate and a magnesium and silver alloy (Ag—Mg) film preventing the substrate from being corroded by ozone and sulfonated components. The Ag—Mg film can undergo native oxidation or provoked oxidation so as to form a thin layer of magnesium oxide (MgO) at its surface. In addition, a resin protective layer can be added. The Ag—Mg protective film possibly with a thin layer of MgO presents the same drawbacks as the metallic and oxidizable alloying elements mentioned above.

OBJECT OF THE INVENTION

It is an object of the invention to provide a silver-base material coating comprising a stack of one main layer and one oxidized thin film and offering a greatly improved sulfidation resistance in comparison with coatings according to the prior art.

More particularly, the object of the invention is to provide a coating offering a greatly improved sulfidation resistance, while preserving the properties of the silver-base material, such as the optical, electrical or antibacterial properties thereof.

According to the invention, this object is achieved by the appended claims. More particularly, this object is achieved by the fact that the oxidized thin film has a thickness comprised between 10 nm and 1 μm and by the fact that it presents a decreasing silver concentration gradient from the interface between the thin film and the main layer to the free surface of the thin film.

It is a further object of the invention to provide a deposition method enabling a coating of silver-base material to be obtained having an improved sulfidation resistance in comparison with coatings according to the prior art.

According to the invention, this object is achieved by the fact that the method comprises at least two successive physical vapor deposition steps respectively of the main layer and of the oxidized thin film.

It is a further object of the invention to use such a coating on an item of jewellery, in an antibacterial device or in a connection device.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

The sulfidation resistance of a silver-base material coating is further improved by achieving, from the free surface of the coating up to a depth comprised between 10 nm and 1 µm and more particularly between 100 nm and 1 µm, a concentration gradient of silver, oxygen and possibly one or more oxidizable alloying elements (or solutes) which may be present in the material.

What is meant by concentration gradient of a chemical element is a continuous variation of the concentration of this said chemical element from the free surface up to a depth comprised between 10 nm and 1 µm.

Figure 1:
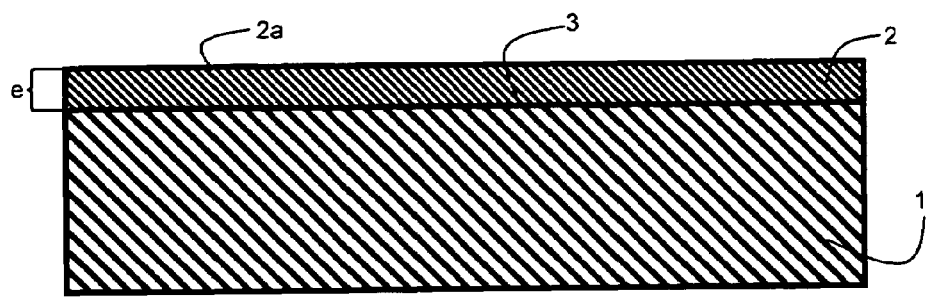
FIG. 1 represents a particular embodiment of a coating according to the invention.

Thus, as represented in FIG. 1, a coating of silver-base material according to the invention comprises a stack of a main layer 1 and an oxidized thin film 2.

The main layer 1 can be a thin layer of silver or of a silver-base alloy. More particularly, the main layer 1 is formed by an alloy comprising, in addition to silver, at least one oxidizable metallic alloying element. The choice of the alloying element or alloying elements is preferably dictated by criteria relating to their ability to form, at the surface, an oxide able to make the alloy resistant to sulfidation. Thus, the alloying element or alloying elements are more particularly chosen according to their solubility in solid silver, their tendency to migrate to the surface and the stability of the oxide they form. More particularly, the alloying element or alloying elements are preferably in priority chosen from tin, indium, zinc and germanium, and secondly from aluminium, magnesium, manganese and titanium. Furthermore, the choice of the alloying element or alloying elements can also be influenced by the application in which the coating is used. Thus, an alloying element can also be chosen according to its input to improve the mechanical properties (for example wear resistance), optical properties (for example reflectivity) and/or electrical properties (for example contact electrical resistance) of the alloy.

Figure 2:
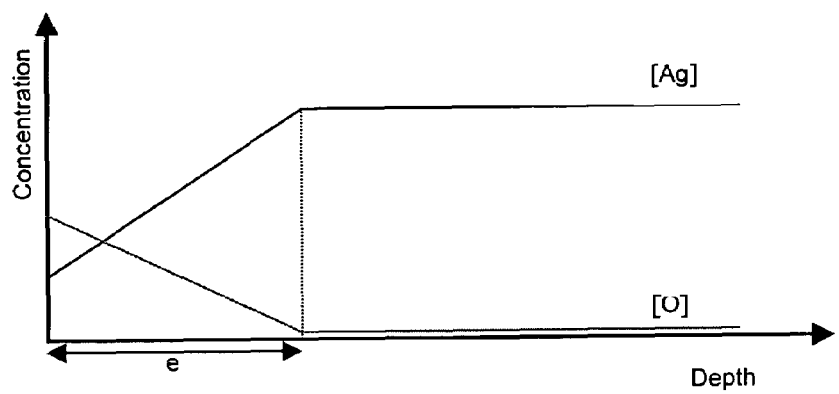
FIG. 2 is a schematic representation of a particular embodiment of evolution of the silver ([Ag]) and oxygen ([O]) concentrations in a coating according to the invention.

The oxidized thin film 2 comprises at least the chemical element or chemical elements constituting the main layer 1 and oxygen. The oxidized thin film 2 has a thickness e comprise between 10 nm and 1 µm and, more particularly, between 100 nm and 1 µm. Moreover, it presents a decreasing silver concentration gradient from the interface 3 between the thin film 2 and the main layer 1 up to the free surface 2a of the thin film 2. The oxygen contained in the thin film 2 is input, deliberately and in controlled manner, during the coating fabrication or deposition process. The thin film 2 comprises an increasing oxygen concentration gradient, i.e. a continuous increasing oxygen variation, from the interface 3 between the thin film 2 and the main layer 1 up to the free surface 2a of the thin film 2. For example, in FIG. 2 schematically representing a particular profile of the silver concentration ([Ag]) and oxygen concentration ([O]) in a coating according to the invention, the variation of the silver concentration and of the oxygen concentration is linear in the thin film 2. In the main layer 1, on the other hand, the silver concentration ([Ag]) and oxygen concentration ([O]) is substantially constant.

Moreover, if the silver-base material is an alloy comprising at least one oxidizable alloying element, the thin film 2 then also presents an increasing alloying element concentration gradient from the interface 3 between the thin film 2 and the main layer 1 up to the free surface 2a of the thin film 2.

Such an oxidized thin film then presents the advantage of going progressively and continuously from a composition corresponding to a passivating oxide present at the free surface 2a of the oxidized thin film 2 to a composition present at the interface 3 of the oxidized thin film 2 and of the main layer 1 and corresponding to a solid solution of silver, rich in oxidizable alloying element. This enables the oxidized thin film 2 to form a much more efficient and more durable protective barrier against sulfidation than the ways envisaged in the state of the technique. Furthermore, the oxidized thin film does not downgrade the properties of the silver-base material, such as the optical, electrical or antibacterial properties thereof.

A coating according to the invention can be deposited on any type of part or support, by means of deposition techniques such as a vacuum deposition method.

According to a particular embodiment, the coating is deposited on a support or a substrate in two successive physical vapor deposition (PVD) steps, so as to successively form the main layer 1 and the oxidized thin film 2.

More particularly, the two deposition steps are magnetron cathode sputtering deposition steps performed in a deposition chamber from a target or cathode formed by a silver-base alloy and at least one alloying element. The two deposition steps are preferably performed with negative polarization of the support. What is meant by negative polarization of the support is that the support designed to receive the coating is subjected to a negative electrical polarization potential with respect to the ground. The support is thus for example subjected to a constant negative first polarization potential during the first deposition step, and then to a constant negative second polarization potential, lower than the first potential, during the second deposition step. The first polarization potential is for example about −130V whereas the second first polarization potential is for example about −300V. This change in the polarization potential value between the two steps of the deposition process thus enables the silver concentration gradient to be achieved in the thin film 2. The re-sputtering rate of silver at the surface of the previously formed main layer 1 is in fact higher than that of the alloying elements, resulting in a superficial enrichment of the thin alloying element film 2, causing the silver and alloying element concentration gradient to be created.

Moreover, oxidation of the thin film 2 is caused by inputting oxygen to the plasma during the thin film deposition step. This oxygen input to the plasma enables a progressive oxygen enrichment to be achieved in the thin film 2 and therefore creates an increasing oxygen concentration gradient from the interface 3 to the free surface 2a of the thin film 2. The degree of oxygen enrichment can be controlled by the value of the polarization potential applied to the support and/or by the value of the oxygen flow input to the plasma. Furthermore, the thickness of the thin film depends on the duration of the second deposition step.

For example, a coating of a ternary silver-base alloy comprising 4% weight of germanium and 8% weight of tin (alloy noted AgGeSn) was deposited on a silicon substrate or anode by magnetron cathode sputtering by means of a target made of AgGeSn alloy. The distance between the target and the support on which the coating is deposited is 80 mm and the other deposition conditions used during the different coating deposition steps are set out in the table below:

| Step | Argon pressure (Pa) | Gas flow rate injected into the chamber (sccm) | Target power (W) | Substrate polarization potential (V) |
|---|---|---|---|---|
| 1) Vacuum creation in the deposition chamber | $8.10^{-4}$ | — | — | — |
| 2) Etching of the target (with mask) | 0.5 | Ar: 145 | 100 | — |
| 3) Deposition of the main layer 1 | 0.5 | Ar: 145 | 300 | −130 |
| 4) Deposition of the oxidized thin film 2 | 0.5 | Ar: 145 $O_2$: 10 to 60 | 300 | −300 |

The duration of the target etching step is about 5 to 10 minutes and the duration of the deposition steps of the main layer 1 and of the thin film 2 depends on the thickness required for each of them.

Figure 3:
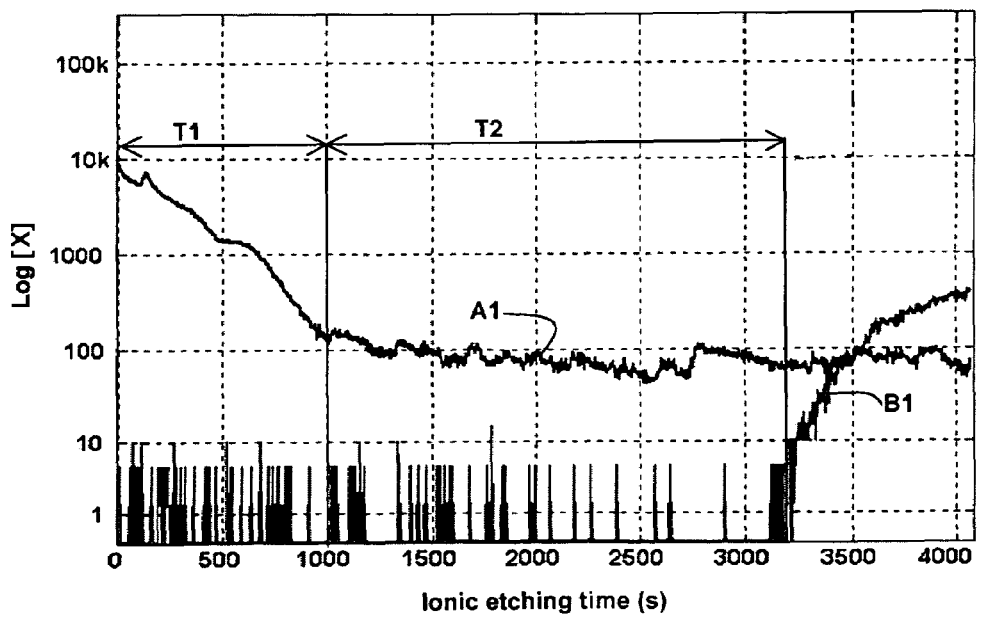
FIGS. 3 and 4 represent the variation of the oxygen concentration and silicon concentration in a coating according to the invention, disposed on a silicon support, versus the ionic etching time used when performing measurement testing with an ionic probe, oxygen having been introduced at the end of the deposition process, with respectively a flow rate of 10 sccm and 25 sccm.
Figure 4:
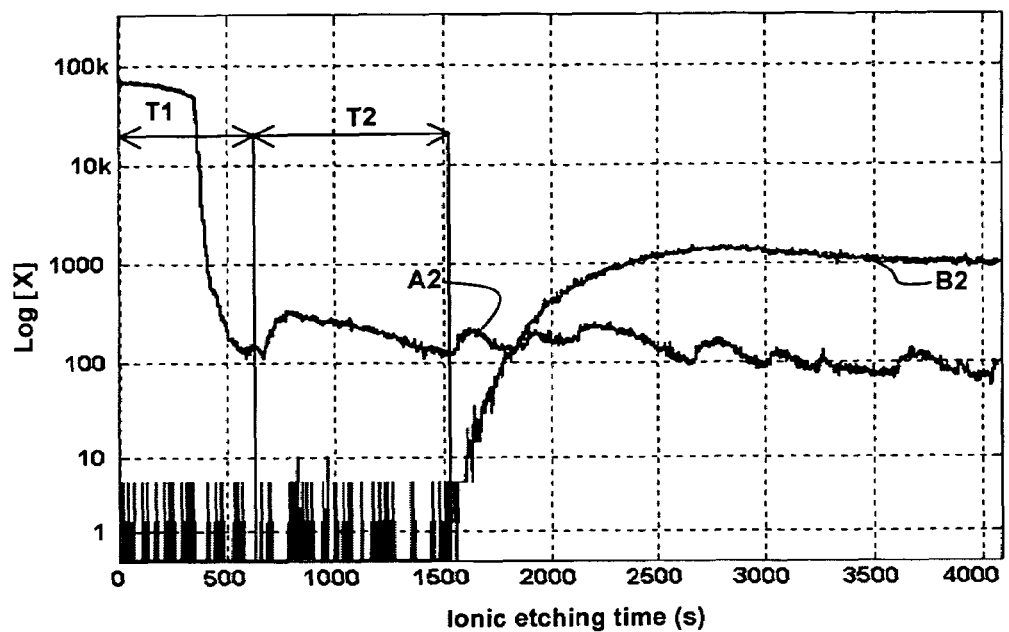

Moreover, the concentration profile of such a coating can be highlighted by ionic probe measurement. Thus, for example, FIGS. 3 and 4 represent the relative evolution of the oxygen and silicon concentrations versus the ionic etching time of an AgGeSn alloy coating with a thickness of 3 μm, respectively for input to the plasma of 10 standard centimeters cube per minute (noted sccm) and 25 sccm of oxygen. The ionic etching time is a function of the depth of the coating from the free surface 2a of the thin film 2 to the silicon substrate. The silicon substrates used in both cases have different thicknesses.

In FIGS. 3 and 4, the two curves corresponding to the oxygen concentration evolution are respectively noted A1 and A2 whereas those corresponding to the silicon concentration evolution are respectively noted B1 and B2. Monitoring of the silicon element by the ionic probe thus makes it possible to determine the moment when the silicon substrate is reached by the primary ion beam used to etch the silicon support whereon a coating according to the invention has been deposited. Monitoring of the oxygen element enables the moment when the main layer 1 of the coating is reached to be determined.

Thus, in FIG. 3, it can be observed that the silicon substrate is reached by etching after about 3250 seconds whereas, in FIG. 4, the silicon substrate is reached after about 1500 seconds. Moreover, it can be observed that, for an oxygen flow rate of 10 sccm, the oxygen concentration decreases progressively with the etching time during a first time period T1, and then stabilizes. Thus, the first time period T1 corresponds to etching of the thin film 2 and the progressive oxygen decrease illustrates the oxygen concentration gradient in the thin film 2, which gradient decreases from the free surface 2a of the thin film 2 (etching time equal to 0) to the interface 3 between the thin film 2 and the main layer 1. Said interface 3 in fact corresponds to the end of the first time period T1, i.e. an ionic etching time of about 1000 seconds. Furthermore, the time period T1 is followed by a second time period T2 corresponding to a time period during which the oxygen concentration is almost constant and the silicon concentration is still almost zero. Thus, this second time period T2 corresponds to etching of the main layer 1 of the coating.

In FIG. 4, the evolution of the oxygen concentration differs from that of FIG. 3. The oxygen content is in fact ten times higher near to the free surface 2a of the thin film 2 than in the first case and it decreases very quickly. In this case, the variation of the oxygen concentration is not a progressive variation. Moreover, the strong oxygen concentration at the free surface of the coating causes a modification of the properties of the coating, in particular increasing the electrical resistivity thereof and therefore reducing the reflectivity thereof. Thus, the coating formed with an oxygen flow rate of 10 sccm is more suitable than that formed with an oxygen flow rate of 25 sccm.

The sulfidation resistance of a coating according to the invention can be evaluated by measuring the color variation of the coating by spectro-photometry, when this coating is exposed to the vapours of an aqueous ammonium sulphide solution. Thus, for example, a beaker with a diameter of 50 mm and a height of 70 mm, containing 1 ml of ammonium sulphide at 4% and 20 ml of distilled water, is placed in a dessicator having a volume of 5 l. A plastic basket containing several coatings of AgGeSn laid flat is placed in the dessiccator, at a predetermined height, for one hour. Then the sulfidation advance is measured by means of a spectrophotometer, enabling a hue to be quantified from three values L, a and b, respectively corresponding:

to the luminance expressed in percentage: from L=0% for black to L=100% for white to a color range ranging from green (a=−120) to red (a=120)

to a color range ranging from blue (b=−120) to yellow (b=120).

In this way a color variation, noted Δ(L, a, b) and corresponding to $((\Delta L)^2+(\Delta a)^2+(\Delta b)^2)^{0.5}$, can be determined by spectrophotometry.

Sulfidation tests were performed:

for AgGeSn coatings obtained by magnetron cathode sputtering on a substrate polarized at a constant potential of −130V and without any oxygen input during the deposition process, such coatings being called C1 coatings, for AgGeSn coatings according to a first embodiment of the invention, called C2 coatings and obtained by magnetron cathode sputtering on a substrate polarized at a constant potential of −130V with input of an oxygen flow of 10 sccm during the second deposition step, for AgGeSn coatings according to a second embodiment of the invention called C3 coatings and obtained by magnetron cathode sputtering on a substrate polarized at a constant potential of −130V during the first deposition step, and then at a second constant potential of −300V during the second deposition step with input of an oxygen flow of 10 sccm during the second deposition step.

Figure 5:
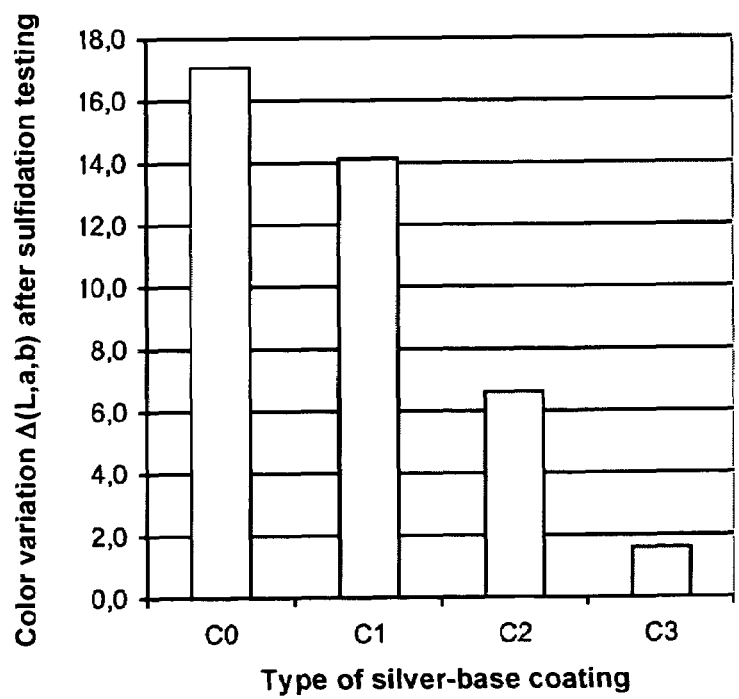
FIG. 5 represents the color variation Δ(L, a, b) observed on silver-base material coatings of C0 to C3 type deposited on a support according to different deposition modes and respectively subjected to sulfidation testing.

Thus, FIG. 5 represents the mean values of the color variation Δ(L, a, b) for the C1 to C3 coatings and for a C0 coating obtained by electrolytic deposition, after one sulfidation testing. It can thus be observed that the C2 and C3 coatings present lower mean color variation values than those of the C0 and C1 coatings. The sulfidation resistance is therefore improved when the coatings are achieved with a modification of the polarization of the substrate between the two steps of the deposition process and/or an oxygen input to the deposition chamber during the second deposition step. Moreover, the mean color variation value of the C3 coatings is lower than that of the C2 coatings. The sulfidation resistance is therefore further improved when the polarization of the substrate is modified at the beginning of the second deposition step and when oxygen is input to the deposition chamber during the second deposition step.

Figure 6:
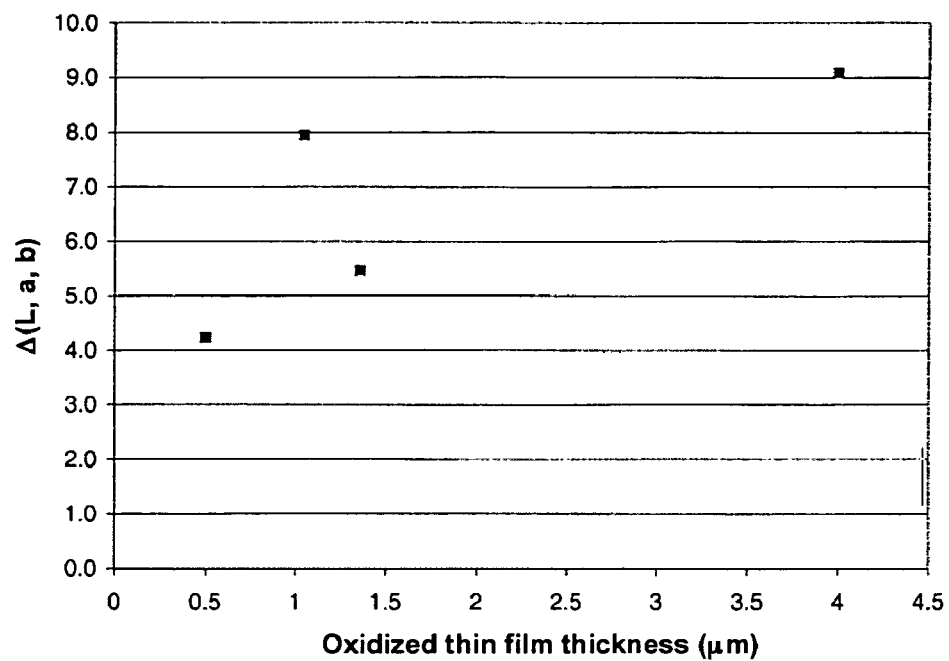
FIG. 6 represents the evolution of the color variation observed on a C2 type coating subjected to sulfidation testing, versus the thickness of the oxidized thin film of said coating.

FIG. 6 represents the evolution of the color variation $\Delta$(L, a, b), after one sulfidation testing, for oxidized thin films 2 of C2 coatings, the oxidized thin films 2 respectively having thicknesses of about 0.5 µm, 1.1 µm, 1.4 µm and 4 µm. It can thus be observed that the oxidized thin film with a thickness of about 0.5 µm presents a higher sulfidation resistance than the other oxidized thin films.

The sulfidation resistance is therefore improved when the coating comprises, over a thickness comprised between 10 nm and 1 µm, respectively decreasing and increasing silver and oxygen concentration gradients from the interface 3 to the free surface 2a.

Figure 7:
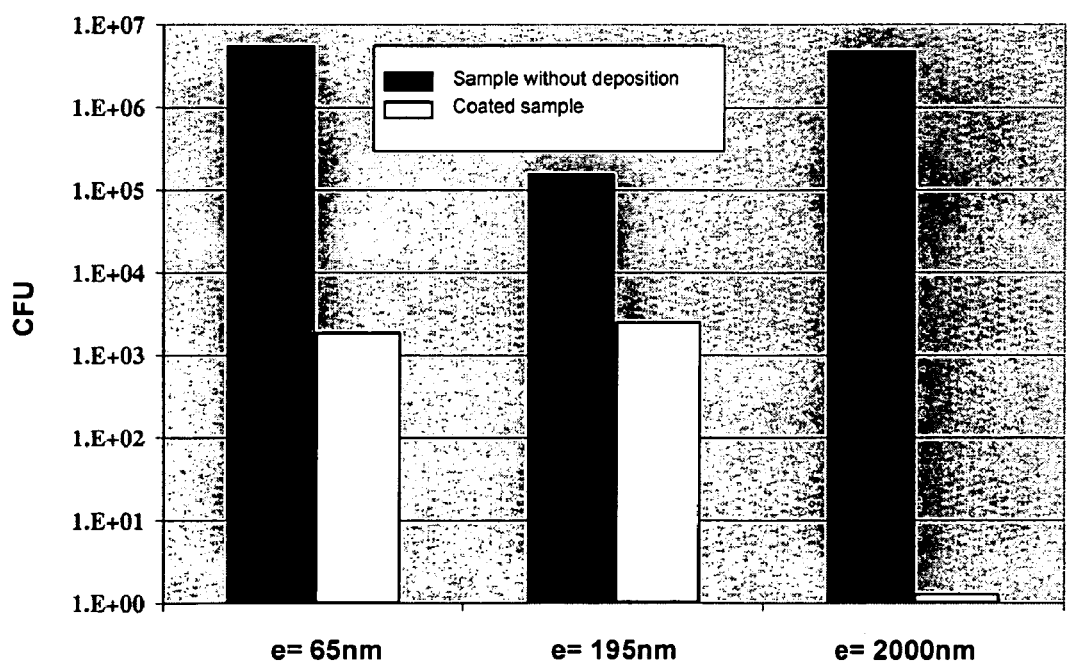
FIG. 7 illustrates the antibacterial activity of different samples coated with a silver-base material coating, in comparison with non-coated samples.

A coating according to the invention also presents the advantage of having an antibacterial activity. For example, as represented in FIG. 7, antibacterial testing was performed on three types of AgGeSn coatings, respectively having thicknesses of 65 nm, 195 nm and 2 µm. Antibacterial testing consists in depositing a standardized bacterial suspension of *staphyloccocus aureus* on two glass plates of the same thickness, one of the two plates comprising a coating according to the invention (called "coated sample" in FIG. 7) and the other one being bare, i.e. devoid of coating (called "sample without deposition" in FIG. 7). Both the glass plates are then covered with a sterile plastic film. They are then placed in a wet incubator at 37° C. for 18 hours. Finally, each plate is dipped in a solution enabling the remaining bacteria to be recovered and counted. The measurement unit of the number of bacteria is the abbreviation CFU corresponding to Colony Forming Unit. Thus, one CFU corresponds to an observed colony, but it can also correspond to several cells if the latter remain aggregated when counting is performed. It can thus be observed, in FIG. 7, that in comparison with the corresponding sample without deposition, each coating has a bactericide effect. The bactericide effect is partial for the 65 nm and 195 nm coatings whereas it is almost total for the coating with a total thickness of 2 µm.

In another embodiment, a coating with a thickness of 185 nm is made on a flat silicon substrate, with an argon pressure of 0.5 Pa, an argon gas flow rate of 140 sccm and with input of oxygen, during the second deposition step, with a flow rate of 30 sccm. The power of the target is 300 W. Antibacterial testing was performed under the same conditions as before, the samples however being placed in a wet incubator at 37° C. for 24 hours. Whereas 3,548,133 CFUs were counted on the bare glass plate, no CFUs were counted on the glass plate comprising the coating. The coating therefore has a total bactericide action.

A coating according to the invention can for example be used to cover an item of jewellery, or in an antibacterial device or in a connection device.

The invention claimed is:

1. Silver-base material coating comprising a stack of one main layer and one oxidized thin film, wherein the oxidized thin film has a thickness between 10 nm and 1 µm, presents a decreasing silver concentration gradient from an interface between the thin film and the main layer to a free surface of the thin film, and silver is present throughout the oxidized thin film,
   wherein the silver-base material is ternary silver-germanium tin alloy.

2. Coating according to claim 1, wherein the oxidized thin film presents an increasing oxygen concentration gradient from the interface between the thin film and the main layer to the free surface of the thin film.

3. Coating according to claim 1, wherein the thin film presents an increasing concentration gradient of tin and/or germanium from the interface between the thin film and the main layer to the free surface of the thin film.

4. Coating according to claim 1, wherein the oxidized thin film has a thickness between 100 nm and 1 µm.

5. Coating according to claim 1, wherein the ternary silver-germanium tin alloy comprises 4% by weight of germanium and 8% by weight of tin.

6. Method for depositing a coating according to claim 1 on a support, comprising at least two successive physical vapor deposition steps, respectively of the main layer and of the oxidized thin film.

7. Method according to claim 6, wherein the deposition steps are deposition steps by magnetron cathode sputtering.

8. Method according to claim 7, wherein the support is subjected to a constant negative first polarization potential, during the deposition step of the main layer and to a constant negative second polarization potential that is lower than the first potential during the deposition step of the oxidized thin film.

9. Method according to claim 7, wherein oxygen is input during the deposition step of the oxidized thin film.

* * * * *